(12) United States Patent
Kieslich et al.

(10) Patent No.: US 6,849,364 B2
(45) Date of Patent: Feb. 1, 2005

(54) MASK FOR FABRICATING SEMICONDUCTOR COMPONENTS

(75) Inventors: Albrecht Kieslich, Radebeul (DE); Hermann Sachse, Dresden (DE)

(73) Assignee: Infineon Technologies AG, Munich (DE)

( * ) Notice: Subject to any disclaimer, the term of this patent is extended or adjusted under 35 U.S.C. 154(b) by 81 days.

(21) Appl. No.: 10/226,743

(22) Filed: Aug. 23, 2002

(65) Prior Publication Data

US 2003/0039899 A1 Feb. 27, 2003

(30) Foreign Application Priority Data

Aug. 23, 2001 (DE) .......................... 101 41 485

(51) Int. Cl.$^7$ ................................. G03F 9/00
(52) U.S. Cl. .................... 430/5; 430/311; 430/322; 430/323
(58) Field of Search .................. 430/5, 311, 322–323

(56) References Cited

U.S. PATENT DOCUMENTS

| 5,242,770 A | | 9/1993 | Chen et al. | |
| 5,663,893 A | | 9/1997 | Wampler et al. | |
| 5,667,918 A | | 9/1997 | Brainerd et al. | |
| 6,503,666 B1 | * | 1/2003 | Pierrat | 430/5 |
| 6,524,752 B1 | * | 2/2003 | Pierrat | 430/5 |
| 6,541,165 B1 | * | 4/2003 | Pierrat | 430/5 |

* cited by examiner

*Primary Examiner*—Geraldine Letscher
(74) *Attorney, Agent, or Firm*—Laurence A. Greenberg; Werner H. Stemer; Gregory L. Mayback

(57) ABSTRACT

A mask for fabricating semiconductor components contains first transparent regions and second transparent regions. The second regions are laid out such that they do not act on the regions of the photoresist directly beneath them in the exposure of the photoresist through the mask. The transparent regions define a size and a shape of structures to be formed.

12 Claims, 1 Drawing Sheet

MASK FOR FABRICATING SEMICONDUCTOR COMPONENTS

BACKGROUND OF THE INVENTION

1. Field of the Invention

The present invention relates to a mask for fabricating semiconductor components. The mask contains transparent regions that determine the position of the structures that will be generated on the semiconductor components.

It is generally known that semiconductor components such as single semiconductors and integrated circuits are fabricated using semiconductor wafers. To accomplish this, the various structures that are needed are generated on the semiconductor wafers, for instance by etching and implantation. The size and position of the structures are typically defined in that such semiconductor wafers are covered surface-wide with what is known as photoresist, portions thereof are exposed, and the exposed portions are developed and removed. The exposure occurs with the aid of masks that are transparent in subregions and otherwise opaque (e.g. with the aid of a chromium coating). The correct generation of the desired structures is thus an extremely complex process, which occurs in several steps per structure which must be precisely tuned to one another and in which the utilized materials and aids must also be precisely tuned to one another. The critical parameters are the size and shape (more rectangular or more square) of the generated structures, the configuration of the structures (individual or several adjoining one another), the properties of the photoresist (particularly its reaction to light), the utilized light (intensity, wavelength of the light), the quality of the photoresist, the distance of the mask from the photoresist or the semiconductor wafer (focus), etc. Combinations of values or value ranges of parameters which are suitable for use in a fabrication process are called processing windows.

Because the structures have been progressively miniaturized in recent years, today the diffraction characteristics of the utilized light, the photo characteristics of the resist, and the geometric shape and potential mutual configuration of the structures that are to be generated exert a large influence and are therefore highly important.

It has been shown that a smaller dose of light is needed to correctly expose the photoresist when the structures being generated will be adjacently disposed than when they will not be. Beyond this, it has been shown that, in the latter case, for structures which will have a substantially square surface, the relevant transparent regions of the utilized mask must not also be square, but rather must be rectangular (what are known as "leads" must be taken into consideration). As a result, the long sides of such a rectangle on the mask could be three times as long as the short sides, for example. A substantially higher exposure dose is needed in the latter cases than in the former case. As a result, a plurality of adjacent structures (which are not yet generated) and individual structures (which are not yet generated) that are further removed from these cannot be exposed at the same time in a single exposure process. A different value can also be required for the focus (exposure distance). All of this is connected with the problem of finding the favorable processing window for the respective application instance. This is well known to the person skilled in the art of semiconductor lithography.

SUMMARY OF THE INVENTION

It is accordingly an object of the invention to provide a mask for fabricating semiconductor components that overcomes the above-mentioned disadvantages of the prior art devices of this general type.

With the foregoing and other objects in view there is provided, in accordance with the invention, a mask for fabricating semiconductor components. The mask contains first transparent regions for determining a position of structures to be generated on the semiconductor components, and second transparent regions. The second transparent regions, in conjunction with the first transparent regions, define a size and a shape of the structures.

In accordance with an added feature of the invention, for each of the structures to be generated, one first transparent region is provided, and a number of the second transparent regions are disposed in an environment of the first transparent region. Preferably, the number of the second transparent regions is at least two.

In accordance with an additional feature of the invention, the second transparent regions have first distances from one another. The first distances have a maximum value below a resolution limit of photoresist. Preferably, the first distances are equal to each other.

In accordance with another feature of the invention, one of the second transparent regions disposed nearest a first transparent region has a second distance from the first transparent region. The second distance is at least equal to the first distances, whereby a value of the second distance is less than the resolution limit of the photoresist.

In accordance with a further feature of the invention, each of the second transparent regions has a stripe shape.

In accordance with a further added feature of the invention, the first transparent regions have long sides, and the second transparent regions are disposed parallel to the long sides of the first transparent regions.

In accordance with a further additional feature of the invention, the first transparent regions have transverse sides, and the second transparent regions are disposed parallel to the transverse sides of the first transparent regions.

In accordance with another further feature of the invention, the first transparent regions have transverse sides, and the second transparent regions disposed transverse to the transverse sides of the first transparent first regions.

In accordance with an added feature of the invention, the first transparent regions and the second transparent regions are utilized for fabricating the semiconductor components.

With the foregoing and other objects in view there is provided, in accordance with the invention, a mask for fabricating semiconductor components. The mask contains first transparent regions for determining a position of structures to be generated on the semiconductor components, and second transparent regions. The second transparent regions, in conjunction with the first transparent regions, define a size and a shape of the structures. The second transparent regions are disposed outside of the first transparent regions.

Other features which are considered as characteristic for the invention are set forth in the appended claims.

Although the invention is illustrated and described herein as embodied in a mask for fabricating semiconductor components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the follow-

DESCRIPTION OF THE PREFERRED EMBODIMENTS

Figure 1A:
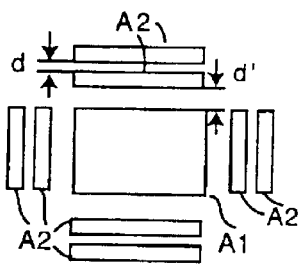
FIG. 1A is a diagrammatic, sectional view of a first embodiment of a mask according the invention.

Referring now to the figures of the drawing in detail and first, particularly, to FIG. 1A thereof, there is shown a sectional representation of a plan view of an inventive mask for exposing a semiconductor wafer which is coated with photoresist. In the center of FIG. 1A is a first transparent region A1 (e.g. made of clear glass). Outside of the first region A1 at a distance from the first region A1 and from one another are second transparent regions A2. The first region A1 serves for determining a position of a structure S (represented in FIG. 1B) that is to be generated on the semiconductor wafer. The second regions A2, in conjunction with the first region A1, determine the size and, to a certain degree, the shape of the structure S.

Figure 1B:
FIG. 1B is a plan view of structures of a first semiconductor component generated by use of the mask shown in FIG. 1A.

When the second regions A2 are disposed relative the first region A1 as represented in FIG. 1A, and a mask of this configuration is utilized in a modern fabrication process for semiconductor components, then the structure S as represented in FIG. 1B emerges in the course of the process.

In one direction the structure S is somewhat shorter than the length of the first region A1 of the mask, while in the other direction it is slightly wider than the width of the first region A1 of the mask. If one wanted to produce the structure S as represented in FIG. 1B use of a conventional mask, i.e. without the inventively provided second regions A2, then the first region A1 on the mask would have to be three times as long as the finished structure S was intended to be (what is known as the "lead scale"). Furthermore, the corners of the structure S would be generated rounded to such a degree that one could no longer speak of a substantially square surface, but rather of a substantially circular surface. But such circular surfaces are disadvantageous particularly when the structure S is a contact surface or a contact hole of a semiconductor component by way of which electrical energy (for instance a supply potential) is to be transmitted during operation. Because the surface dimension of such a circular surface is smaller than that of a rectangular or square surface, the electrical resistance of the contact surface or the contact hole increases, which leads to a higher current consumption and more waste heat. Both are undesirable. In order to achieve a circular surface of the same surface dimension as a corresponding rectangular or square surface, the structure S would have to be expanded (in diameter), which leads to a larger space requirement for the overall semiconductor component. As is generally known, this is also undesirable.

The inventively provided second regions A2 solve this problem. The structures S produced with their aid have surfaces that are as rectangular or square as possible. The corners are only negligibly rounded, if at all; and the space requirement of the structure S is optimized.

It is inventively provided that the mask for a structure that is to be fabricated in this way contains the first region A1 and at least two of the second regions A2, for instance parallel to the short sides of the first region A1. In any case, it is favorable to dispose at least two second regions A2 on each side of the first region A1 as represented in FIG. 1A. It is advantageous when first distances d of the second regions A2 from one another and second distances d' of the first region A1 from the second regions A2 that are disposed next to it have maximum values which are less than the resolution limit of the photoresist that is utilized for fabricating semiconductor components. Namely, (in such a fabrication process) the effect of the second regions A2 on the region of the photoresist directly beneath them is the same as if the second regions A2 were not even there; that is, the second regions have no influence on the development process of the photoresist at these locations, but rather only in the region directly beneath the first region A1. Advantageously, the first distances d are all selected equal.

In the embodiment according to FIG. 1A, the second regions A2 are disposed parallel to the two long sides of the first region A1 and parallel to the two short sides of the first region A1.

Figure 2A:
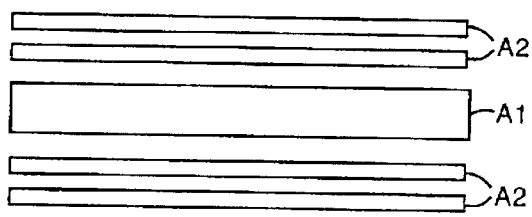
FIG. 2A is a diagrammatic, sectional view of a second embodiment of the mask.
Figure 2B:
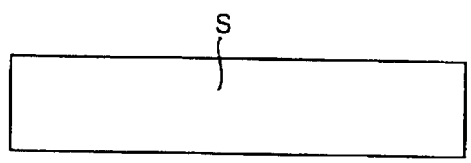
FIG. 2B is a plan view of structures of a second semiconductor component generated using the mask according to FIG. 2A.

In the embodiment according to FIG. 2A, on the other hand, the second regions A2 are only disposed parallel to the two long sides of the first region A1. There are no second regions A2 along the short sides of the first region A1. But this is not required, because the longitudinal extent of the first region A1 in this exemplifying embodiment is so large (compared to the first region A1 represented in FIG. 1A) that this dimensioning is no longer critically small. FIG. 2B represents the structure S as it emerges given utilization of the inventive mask according to FIG. 2A in the context of a semiconductor component fabrication process. It can be seen here, as well, that the structure S is wider than the first region A1 of the mask itself. The length is the same in this case, however (which is a non-critical case in terms of dimensioning).

Figure 3:
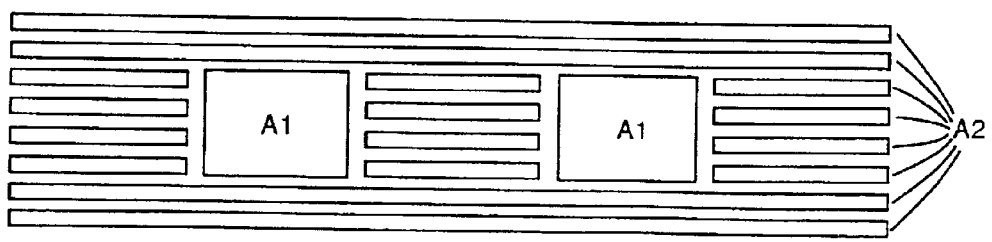
FIG. 3 is a sectional view of a third embodiment of the mask.

The embodiment according to FIG. 3 represents two first regions A1 (dimensions assumed critical), which are surrounded by the second regions A2 on all sides. However, all second regions A2 are oriented in the same direction. The second regions A2 that laterally adjoin the long sides of the first regions A1 extend parallel to the long sides. But the second regions A2 that laterally adjoin the (short) transverse sides of the first regions A1 extend perpendicular to the transverse sides. Overall, the second regions A2 are disposed in a strip shape.

The foregoing obviously assumes that the mask is opaque between the first region A1 and the second regions A2, and between the second regions A2 themselves, which can be achieved by use of chromium.

As a whole, the present invention offers the advantage that the fabrication processes for semiconductor components in which very small critical dimensions of structures must be taken into consideration are easier to carry out to the extent that lithographic processing steps for such structures, a plurality of which are disposed in the immediate environment of one another, and lithographic processing steps for such structures which are disposed substantially farther from other structures, no longer need to be carried out separately with the aid of different processing windows; rather, they can be carried out together with the aid of a single common processing window. This is possible because processing windows that are applicable in both types of processing steps can be defined by the present invention. As described above and generally known in the field of photolithography of semiconductor components, a processing window is a combination of values of specific parameters (examples: exposure dose, exposure time, focus, structural dimensions, wavelength of the utilized light), which make it possible to be able to successfully perform certain processing steps, here lithographic processing steps. Besides this, when the inventive mask is utilized in the fabrication of semiconductor components, the effects of the negative influences of tolerance value fluctuations which occur in production equipment are reduced, which ultimately lowers the production costs owing to the higher yield and/or the reduced volume of post-processing that is required.

We claim:

1. A mask for fabricating semiconductor components, comprising:

first transparent regions for determining a position of structures to be generated on the semiconductor components; and second transparent regions, in conjunction with said first transparent regions, defining a size and a shape of the structures.

2. The mask according to claim 1, wherein for each of the structures to be generated, one of said first transparent regions is provided, and a number of said second transparent regions are disposed in an environment of each of said first transparent regions.

3. The mask according to claim 1, wherein said second transparent regions have first distances from one another, the first distances having a maximum value below a resolution limit of photoresist.

4. The mask according to claim 3, wherein said first distances are equal.

5. The mask according to claim 4, wherein one of said second transparent regions being disposed nearest a respective one of said first transparent regions has a second distance from said respective one of said first transparent regions, said second distance is at least equal to said first distances, whereby a value of said second distance is less than the resolution limit of the photoresist.

6. The mask according to claim 1, wherein each of said second transparent regions has a stripe shape.

7. The mask according to claim 1, wherein said first transparent regions have long sides, and said second transparent regions disposed parallel to said long sides of said first transparent regions.

8. The mask according to claim 1, wherein said first transparent regions have transverse sides, and said second transparent regions disposed parallel to said transverse sides of said first transparent regions.

9. The mask according to claim 1, wherein said first transparent regions have transverse sides, and said second transparent regions disposed transverse to said transverse sides of said first transparent first regions.

10. The mask according to claim 1, wherein said first transparent regions and said second transparent regions are utilized for fabricating the semiconductor components.

11. The mask according to claim 2, wherein said number of said second transparent regions is at least two.

12. A mask for fabricating semiconductor components, comprising:

first transparent regions for determining a position of structures to be generated on the semiconductor components; and second transparent regions, in conjunction with said first transparent regions, defining a size and a shape of the structures, said second transparent regions disposed outside of said first transparent regions.

* * * * *